United States Patent
Miyairi et al.

(10) Patent No.: US 8,735,231 B2
(45) Date of Patent: May 27, 2014

(54) MANUFACTURING METHOD OF DUAL-GATE THIN FILM TRANSISTOR

(75) Inventors: Hidekazu Miyairi, Kanagawa (JP); Takafumi Mizoguchi, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 323 days.

(21) Appl. No.: 13/214,443

(22) Filed: Aug. 22, 2011

(65) Prior Publication Data

US 2012/0049283 A1    Mar. 1, 2012

(30) Foreign Application Priority Data

Aug. 26, 2010    (JP) .................................. 2010-189916

(51) Int. Cl.

| | | |
|---|---|---|
| *H01L 21/336* | (2006.01) | |
| *H01L 21/00* | (2006.01) | |
| *H01L 21/84* | (2006.01) | |
| *H01L 21/70* | (2006.01) | |
| *H01L 21/283* | (2006.01) | |
| *H01L 29/786* | (2006.01) | |

(52) U.S. Cl.
CPC .............. *H01L 21/707* (2013.01); *H01L 21/84* (2013.01); *H01L 21/283* (2013.01); *H01L 29/78648* (2013.01)
USPC ............ 438/157; 438/158; 438/164; 438/176

(58) Field of Classification Search
CPC .................. H01L 21/02422; H01L 29/78648; H01L 21/707; H01L 21/84; H01L 21/702; H01L 21/283
USPC .......................... 438/157, 158, 164, 176, 155; 257/E21.412
See application file for complete search history.

(56) References Cited

U.S. PATENT DOCUMENTS

| | | | |
|---|---|---|---|
| 5,923,963 A * | 7/1999 | Yamanaka | 438/157 |
| 2010/0032679 A1 | 2/2010 | Kawae et al. | |
| 2010/0148175 A1 | 6/2010 | Godo et al. | |
| 2010/0244022 A1* | 9/2010 | Takahashi et al. | 257/43 |
| 2010/0244034 A1 | 9/2010 | Miyairi | |
| 2011/0024750 A1* | 2/2011 | Yamazaki et al. | 257/57 |
| 2011/0032444 A1* | 2/2011 | Yamazaki et al. | 349/42 |
| 2011/0121300 A1 | 5/2011 | Miyairi et al. | |
| 2011/0147754 A1 | 6/2011 | Isa et al. | |
| 2011/0147755 A1 | 6/2011 | Miyairi et al. | |

FOREIGN PATENT DOCUMENTS

| | | |
|---|---|---|
| JP | 07-064108 | 3/1995 |
| JP | 2001-217424 | 8/2001 |

* cited by examiner

*Primary Examiner* — Shouxiang Hu
(74) *Attorney, Agent, or Firm* — Nixon Peabody LLP; Jeffrey L. Costellia

(57) ABSTRACT

A dual-gate transistor including: a first insulating layer provided to cover a first conductive layer; a first semiconductor layer over the first insulating layer; second semiconductor layers over the first semiconductor layer, the second semiconductor layers are spaced from each other to expose the first semiconductor layer; impurity semiconductor layers over the second semiconductor layers; second conductive layers over the impurity semiconductor layers; second insulating layers over the second conductive layers; a third insulating layer to cover the first semiconductor layer, the second semiconductor layers, the impurity semiconductor layers, the second conductive layers, and the second insulating layers; and a third conductive layer at least over the third insulating layer, and in the dual-gate transistor including the first to third insulating layers with openings, the first insulating layer is substantially equal in thickness to the second insulating layer.

6 Claims, 9 Drawing Sheets

MANUFACTURING METHOD OF DUAL-GATE THIN FILM TRANSISTOR

BACKGROUND OF THE INVENTION

1. Field of the Invention

The present invention relates to a semiconductor device and a manufacturing method thereof. It is to be noted that in this specification, a semiconductor device refers to a semiconductor element itself or a device including a semiconductor element. Examples of such a semiconductor element include, for example, a thin film transistor. Accordingly, the semiconductor device also includes devices such as liquid crystal display devices.

2. Description of the Related Art

In recent years, semiconductor devices have been essential for human life. Semiconductor elements such as thin film transistors included in the semiconductor devices are manufactured by forming a thin film such as a semiconductor film on a substrate and processing the thin film into a desired shape. This type of manufacturing method has been also applied to, for example, liquid crystal display devices (for example, liquid crystal televisions).

For thin film transistors in conventional liquid crystal televisions, an amorphous silicon film has been often used as the semiconductor film. This is because a thin film transistor formed using an amorphous silicon film has a structure which can be relatively easily formed.

However, in view of the recent situation of moving images (for example, watching movies in 3D and watching sports in 3D), it has been difficult to express the sharpness of moving images in the case of liquid crystal televisions using amorphous silicon films, and the development of thin film transistors which show a fast response and have a high carrier mobility has been advanced. Therefore, the development of microcrystalline silicon films has been advanced (for example, Patent Document 1).

REFERENCE

[Patent Document 1] Japanese Published Patent Application No. 2001-217424

SUMMARY OF THE INVENTION

As also described in Patent Document 1, in the case of a thin film transistor using a microcrystalline silicon film, it is possible to increase the on-state current. However, in view of the recent situation of moving images described above, it can hardly be said that the on-state current is sufficiently high.

Therefore, "a further gate electrode (hereinafter, which may be referred to as a second gate electrode)" may be preferably provided on the side opposite to a gate electrode (hereinafter, which may be referred to as a first gate electrode) so as to overlap with a channel forming region, so that the further gate electrode broaden the channel forming region. More specifically, a dual-gate thin film transistor may be employed.

However, in contrast to conventional thin film transistors, the dual-gate thin film transistor with "the further gate electrode" and "a further gate insulating layer" provided has a further complex stacked structure. Therefore, as compared with conventional thin film transistors, the dual-gate thin film transistor has, for example, a section in which the thickness of a film to be etched varies greatly in an etching process. When the thickness of the film to be etched varies greatly, the etching damage will be increased near the surface of the layer provided under the thin film to be etched.

Alternatively, the layer provided under the thin film to be etched is etched, thereby causing defective wiring formation, and thus causing a decrease in yield.

An object of an aspect according to the present invention is to provide a semiconductor device including a dual-gate thin film transistor with less etching damage to electrodes.

Furthermore, an object of another aspect according to the present invention is to provide a method for manufacturing a semiconductor device including a dual-gate thin film transistor with less etching damage to electrodes, with a high yield in accordance with a simplified process.

A semiconductor device according to an aspect of the present invention includes a dual-gate thin film transistor which has an inverted staggered structure, and the thin film transistor is characterized in that an interlayer insulating layer is provided between a conductive layer to serve as a source electrode and a drain electrode and a passivation layer, a gate electrode is further provided on the passivation layer, and the gate insulating layer and interlayer insulating layer of the thin film transistor are almost equal in thickness to each other.

In a method for manufacturing a semiconductor device according to an aspect of the present invention, in the case of manufacturing a dual-gate thin film transistor which has an inverted staggered structure, a film to serve as an interlayer insulating film, which is provided between a conductive layer to serve as a source electrode and a drain electrode and a passivation layer, is formed by laminating onto a conductive film to serve as a source electrode and a drain electrode, and formed with the use of the same etching mask as in the formation of the conductive layer to serve as a source electrode and a drain electrode, or formed with the use of the conductive layer to serve as a source electrode and a drain electrode as an etching mask. Furthermore, the gate insulating layer and interlayer insulating layer of the thin film transistor are almost equal in thickness to each other.

An aspect of the present invention is a semiconductor device comprising: a first insulating layer provided to cover a first conductive layer; a first semiconductor layer provided over the first insulating layer; second semiconductor layers provided over the first semiconductor layer, which are spaced from each other to expose the first semiconductor layer; impurity semiconductor layers provided over the second semiconductor layers; second conductive layers provided over the impurity semiconductor layers so as to be at least partially in contact with the impurity semiconductor layers; second insulating layers provided over the second conductive layers; a third insulating layer provided to cover the first semiconductor layer, the second semiconductor layers, the impurity semiconductor layers, the second conductive layers, and the second insulating layers; and a third conductive layer provided at least over the third insulating layer, wherein a first opening reaching a portion of the first conductive layer is provided in the first insulating layer and the third insulating layer, wherein a second opening reaching a portion of the second conductive layer is provided in the second insulating layers and the third insulating layer, and wherein the first insulating layer is equal in thickness to the second insulating layer.

Alternatively, according to an aspect of the present invention, the depth of the first opening may be substantially equal to the depth of the second opening.

It is to be noted that in this case, the second insulating layer corresponds to the interlayer insulating layer, whereas the third insulating layer corresponds to the passivation layer. In addition, the second conductive layer constitutes at least a source electrode and a drain electrode, whereas the third conductive layer constitutes at least a second gate electrode.

In the structure described above, the third insulating layer is preferably thin. The third insulating layer constitutes a gate insulating layer provided between the second gate electrode and the semiconductor layer. Therefore, the field effect mobility of the thin film transistor is improved to increase the on-state current, when the gate insulating layer provided between the semiconductor layer and the second gate electrode is made thinner to reduce the effective film thickness.

It is to be noted that when the second conductive layer and the third conductive layer are provided to be overlapped with each other, the third insulating layer made thinner will increase the parasitic capacitance between the source electrode and drain electrode composed of the second conductive layer and the second gate electrode composed of the third conductive layer. Therefore, the second insulating layer may be rather made thicker.

On the other hand, the third insulating layer made thicker as described above has no actual advantage. Accordingly, in the structure described above, the third insulating layer is preferably thinner than the first insulating layer and than the second insulating layer.

In the structure described above, the third conductive layer can connect the first conductive layer and the second conductive layer through the first opening and the second opening.

An aspect of the present invention is a method for manufacturing the semiconductor device described above. An aspect of the present invention is a method for manufacturing a semiconductor device, wherein a thin film laminated body including a first semiconductor layer, a second semiconductor layer, and an impurity semiconductor layer stacked in this order is formed over a first insulating layer provided to cover a first conductive layer, wherein a conductive film to serve as a second conductive layer and an insulating film to serve as a second insulating layer are formed to cover the thin film laminated body, wherein the insulating film is subjected to etching to form the second insulating layer, wherein the conductive film is subjected to etching to form the second conductive layer, wherein the impurity semiconductor layer and the second semiconductor layer in a section in which the impurity semiconductor layer and the second semiconductor layer are not overlapped with the second conductive layer are removed to exposed the first semiconductor layer in the section, thereby forming a semiconductor element, wherein a third insulating layer is formed to cover the semiconductor element, wherein a first opening reaching a portion of the first conductive layer is formed in the first insulating layer and the third insulating layer, wherein a second opening reaching a portion of the second conductive layer is formed in the second insulating layer and the third insulating layer, and wherein the first insulating layer is equal in thickness to the second insulating layer.

Alternatively, an aspect of the present invention is a method for manufacturing a semiconductor device, wherein a thin film laminated body including a first semiconductor layer, a second semiconductor layer, and an impurity semiconductor layer stacked in this order is formed over a first insulating layer provided to cover a first conductive layer, wherein a conductive film to serve as a second conductive layer and an insulating film to serve as a second insulating layer are formed to cover the thin film laminated body, wherein the insulating film is subjected to etching to form the second insulating layer, wherein the conductive film is subjected to etching to form the second conductive layer, wherein the impurity semiconductor layer and the second semiconductor layer in a section in which the impurity semiconductor layer and the second semiconductor layer are not overlapped with the second conductive layer are removed to exposed the first semiconductor layer in the section, thereby forming a semiconductor element, wherein a third insulating layer is formed to cover the semiconductor element, wherein a first opening reaching a portion of the first conductive layer is formed in the first insulating layer and the third insulating layer, wherein a second opening reaching a portion of the second conductive layer is formed in the second insulating layer and the third insulating layer, and wherein the first opening is equal in depth to the second opening.

In the method described above, the second insulating layer and the second conductive layer are preferably formed in accordance with the same etching step.

In the method described above, the exposed portion of the first semiconductor layer may be rather exposed to plasma from a mixed gas including a hydrogen gas and an oxygen gas.

It is to be noted that the first semiconductor layer is not indispensable in the method described above.

The semiconductor device according to an aspect of the present invention can provide a semiconductor device including a dual-gate thin film transistor which has less etching damage to electrodes. More specifically, the semiconductor device according to an aspect of the present invention can provide a semiconductor device which has less etching damage to electrodes, has a high field effect mobility, and provides a high on-state current.

The method for manufacturing a thin film transistor according to an aspect of the present invention can provide a semiconductor device including a dual-gate thin film transistor which has less etching damage to electrodes in accordance with a simplified process. More specifically, the method for manufacturing a thin film transistor according to an aspect of the present invention can manufacture a semiconductor device which has a high field effect mobility and provides a high on-state current, with less etching damage to electrodes and with a high yield in accordance with a simplified process.

BRIEF DESCRIPTION OF THE DRAWINGS

FIGS. 6A-1 through 6D-1 and 6A-2 through 6D-2 are diagrams illustrating a method for manufacturing a semiconductor device according to an embodiment of the present invention;

DETAILED DESCRIPTION OF THE INVENTION

Embodiments of the present invention will be described below in detail with reference to the accompanying drawings. However, the present invention is not limited to the following description and it is easily understood by those skilled in the art that the mode and details can be variously changed without departing from the scope and spirit of the present invention. Accordingly, the invention should not be construed as being limited to the description of the embodiments below.

Embodiment 1

In the present embodiment, a semiconductor device according to an embodiment of the present invention will be described with reference to the drawings.

Figure 1A:
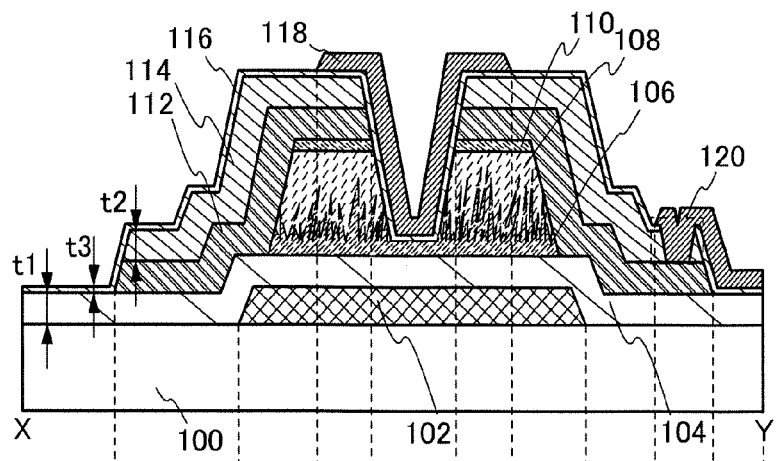
FIG. 1A and FIGS. 1B and 1C are respectively a cross-sectional view and top views illustrating a semiconductor device according to an embodiment of the present invention.
Figure 1B:
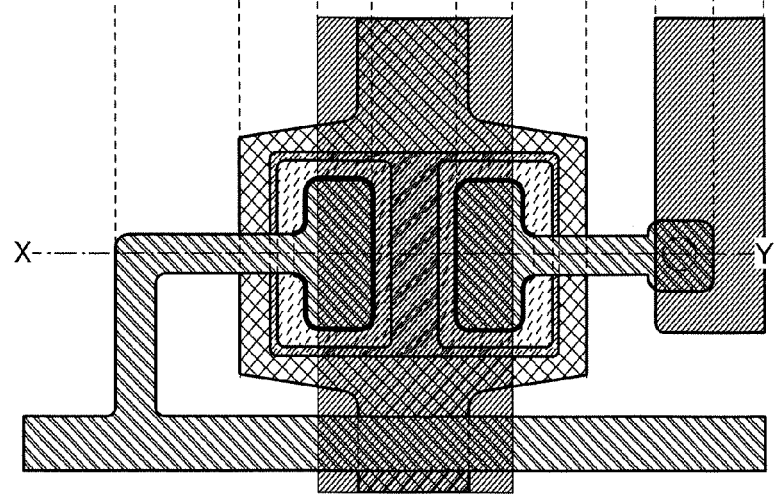
Figure 1C:
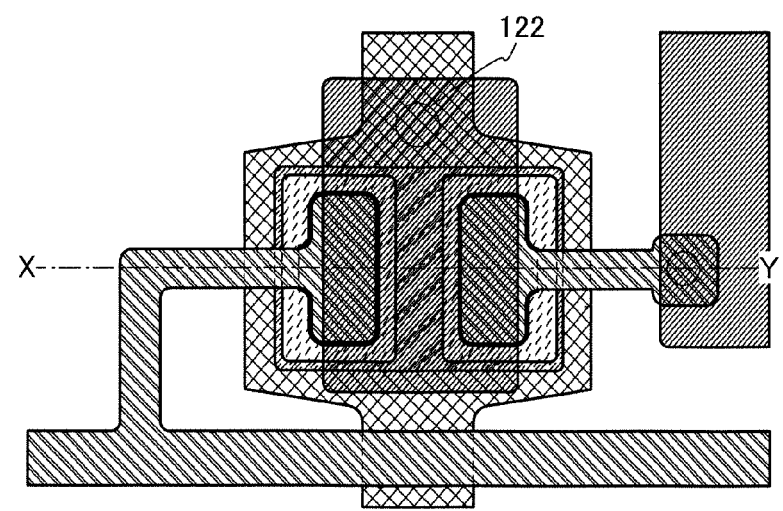

FIG. 1A and FIGS. 1B and 1C are respectively a cross-sectional view and top views illustrating a semiconductor device according to an embodiment of the present invention. FIG. 1A shows a cross-sectional view along the line X-Y of the top view shown in FIG. 1B. The semiconductor device shown in FIGS. 1A and 1B includes: a first conductive layer 102 provided on a substrate 100; a first insulating layer 104 covering the first conductive layer 102; a first semiconductor layer 106 provided on the first insulating layer 104; a second semiconductor layer 108 provided on the first semiconductor layer 106, the second semiconductor layers are spaced from each other to expose the first semiconductor layer 106; an impurity semiconductor layer 110 provided on the second semiconductor layer 108; a second conductive layer 112 provided on the impurity semiconductor layer 110 so as to be at least partially in contact with the impurity semiconductor layer 110; a second insulating layer 114 provided only on the second conductive layer 112; a third insulating layer 116 provided to cover the first semiconductor layer 106, the second semiconductor layer 108, the impurity semiconductor layer 110, the second conductive layer 112, and the second insulating layer 114; and a third conductive layer 118 provided at least on the third insulating layer 116. The second conductive layer 112 and the third conductive layer 118 are connected to each other at a first opening 120. In this case, the thickness $t_1$ of the first insulating layer 104 is substantially the same as the thickness $t_2$ of the second insulating layer 114, that is, $t_1 \approx t_2$.

It is to be noted that the second insulating layer 114 serves as an interlayer insulating layer. The third insulating layer 116 constitutes at least a passivation layer and a gate insulating layer for a second gate electrode composed of the third conductive layer 118. Furthermore, the second conductive layer 112 constitutes at least a source electrode and a drain electrode.

It is to be noted that the third insulating layer 116 is preferably thin. More specifically, the thickness $t_3$ of the third insulating layer 116 is preferably small. This is because the field effect mobility of the thin film transistor can be improved to increase the on-state current when the gate insulating layer is made thinner to reduce the effective film thickness, while the third insulating layer 116 constitutes the gate insulating layer provided between the second gate electrode composed of the third conductive layer 118 and the first semiconductor layer 106.

It is to be noted that when the second conductive layer 112 and the third conductive layer 118 are provided to be overlapped with each other, the third insulating layer 116 made thinner will increase the parasitic capacitance between the source electrode and drain electrode composed of the second conductive layer 112 and the second gate electrode composed of the third conductive layer 118. Therefore, the second insulating layer 114 may be rather made thicker. More specifically, the thickness $t_2$ of the second insulating layer 114 is preferably large.

On the other hand, the third insulating layer 116 made thicker as described above has no actual advantage. Accordingly, in the structure described above, the thickness $t_3$ of the third insulating layer 116 is preferably smaller than the thickness $t_1$ of the first insulating layer 104 and than the thickness $t_2$ of the second insulating layer 114.

It is to be noted that the first insulating layer 104, the second insulating layer 114, and the third insulating layer 116 are preferably silicon nitride layers.

It is to be noted that when the first insulating layer 104 and the second insulating layer 114 are silicon nitride layers, the first insulating layer 104 may have a thickness of approximately 250 nm or more and 450 nm or less.

Furthermore, when the third insulating layer 116 is a silicon nitride layer, the third insulating layer 116 may have a thickness of 60 nm or mode and less than 250 nm.

More specifically, among the first insulating layer 104, the second insulating layer 114, and the third insulating layer 116, the third insulating layer 116 may have the smallest thickness, whereas the first insulating layer 104 and the second insulating layer 114 may have the same level of thickness. More specifically, the relationship of $t_3 < t_1 \approx t_2$ is preferable.

FIG. 1B shows a form in which the gate formed from the third conductive layer 118 is provided independently from the gate formed from the first conductive layer 102. In this case, the electric potential of the gate formed from the third conductive layer 118 may differ from the electric potential of the gate formed from the first conductive layer 102, and the threshold voltage of the thin film transistor can be thus controlled. However, the semiconductor device according to the present embodiment is not limited to this form, and another form as shown in FIG. 1C may also be employed.

FIG. 1C shows a top view of the form in which the gate formed from the third conductive layer 118 is connected to the gate formed from the first conductive layer 102 at a second opening 122. In this case, the electric potential of the gate formed from the third conductive layer 118 is equal to the electric potential of the gate formed from the first conductive layer 102. In this case, the depth of the first opening 120 may be equal to the depth of the second opening 122.

It is to be noted that, although not shown, the third conductive layer 118 can also connect the first conductive layer 102 and the second conductive layer 112 through the first opening 120 and the second opening 122.

It is to be noted that the first insulating layer 104, the second insulating layer 114, and the third insulating layer 116 are not limited to silicon nitride layers. Furthermore, these layers may be provided by stacking multiple layers. For example, a two-layer structure of a silicon oxynitride layer stacked on a silicon nitride layer may be employed as the second insulating layer 114, or a three-layer structure may be employed which has a silicon oxynitride layer provided on a silicon oxide layer and has a silicon nitride layer provided on the silicon oxynitride layer.

It is to be noted that the gate formed from the third conductive layer 118 is not limited to the form shown. In the case of the gate formed from the third conductive layer 118, the gate electrode and the gate wiring may be provided as different layers, in such a way that the gate electrode is provided from the third conductive layer 118, whereas a separate conductive layer is further formed on an insulating layer provided on the third conductive layer 118 to form the gate wiring from the separate conductive layer.

Alternatively, only the gate may be formed from the third conductive layer 118, whereas a pixel electrode may be provided from another different conductive layer differing from the third conductive layer 118.

The semiconductor device as shown in FIGS. 1A to 1C has less etching damage to the electrodes, has a high field effect mobility, and can increase the on-state current.

Embodiment 2

In the present embodiment, a method for manufacturing the semiconductor device described in Embodiment 1 will be described.

Figure 2A:
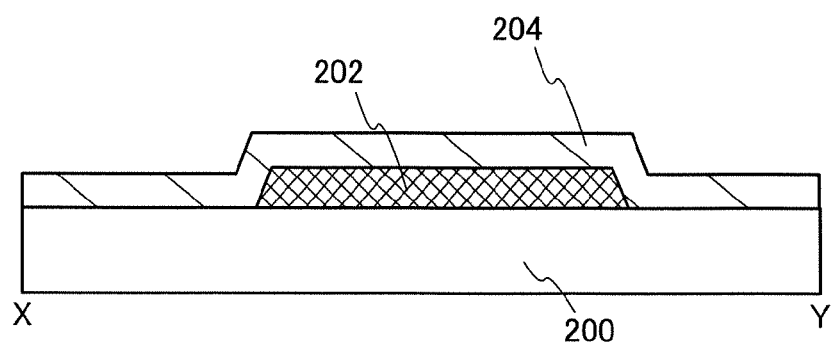
FIGS. 2A to 2C are diagrams illustrating a method for manufacturing a semiconductor device according to an embodiment of the present invention.

First, a first conductive layer 202 is selectively formed on a substrate 200, and a first insulating layer 204 is formed to cover the first conductive layer 202 (FIG. 2A).

The substrate 200 is an insulating substrate. As the substrate 200, in addition to a glass substrate, a quartz substrate, and a ceramic substrate, for example, a plastic substrate or the like can be used which heat resistance to such an extent that can withstand process temperatures in this manufacturing process. When the substrate 200 is a glass substrate, the substrate may have any size of from the first generation (e.g., 320 mm×400 mm) to the tenth generation (e.g., 2950 mm×3400 mm). However, the substrate is not limited to the size.

The first conductive layer 202 may be selectively formed by forming a conductive film (e.g., a metal film or a semiconductor film doped with an impurity element for imparting one conductivity type) with the use of a sputtering method, and forming an etching mask on the conductive film to carry out etching. Alternatively, an ink-jet method or the like may be used. It is to be noted that the conductive film to serve as the first conductive layer 202 may be formed to have either a single layer or multiple layers stacked. For example, a three-layer structure may be employed which has an Al layer sandwiched between Ti layers. It is to be noted that the first conductive layer 202 constitutes at least a scan line and a gate electrode.

The first insulating layer 204 may be formed from an insulating material (e.g., silicon nitride, silicon nitride oxide, silicon oxynitride, or silicon oxide), with the use of a plasma CVD method, for example. It is to be noted that the first insulating layer 204 may be formed to have either a single layer or multiple layers stacked. In this embodiment, a stacked structure of two layers is employed which has a silicon oxynitride layer stacked on a silicon nitride layer, for example. It is to be noted that the first insulating layer 204 constitute at least a gate insulating layer.

It is to be noted that "silicon nitride oxide" contains nitrogen and oxygen in its composition so that the nitrogen content is higher than the oxygen content, and in the case of measurements made with the use of Rutherford Backscattering Spectrometry (RBS) and Hydrogen Forward Scattering (HFS), preferably contains oxygen, nitrogen, silicon, and hydrogen in composition ranges from 5 atomic % to 30 atomic %, from 20 atomic % to 55 atomic %, from 25 atomic % to 35 atomic %, and from 10 atomic % to 30 atomic %, respectively.

The "silicon oxynitride" contains oxygen and nitrogen in its composition so that the oxygen content is higher than the nitrogen content, and in the case of measurements made with the use of RBS and HFS, preferably contains oxygen, nitrogen, silicon, and hydrogen in composition ranges from 50 atomic % to 70 atomic %, from 0.5 atomic % to 15 atomic %, from 25 atomic % to 35 atomic %, and from 0.1 atomic % to 10 atomic %, respectively.

However, the content ratios of nitrogen, oxygen, silicon, and hydrogen fall within the ranges given above, when the total number of atoms constituting the silicon oxynitride or the silicon nitride oxide is defined as 100 atomic %.

It is to be noted in this embodiment that when the uppermost layer of the first insulating layer 204 is a silicon nitride layer or a silicon nitride oxide layer, the surface of the first insulating layer 204 is preferably exposed to plasma generated from a $N_2O$ gas. This is because when the surface of the first insulating layer 204 is exposed to plasma generated from a $N_2O$ gas, the surface of the first insulating layer 204 can be oxidized to improve the crystallinity of the first semiconductor film 206 formed on the surface. However, the gas for generating plasma is not limited to the $N_2O$ gas, and may be any gas (an oxidizing gas or a gas containing oxygen) which can oxidize the surface of the first insulating layer 204.

Figure 2B:
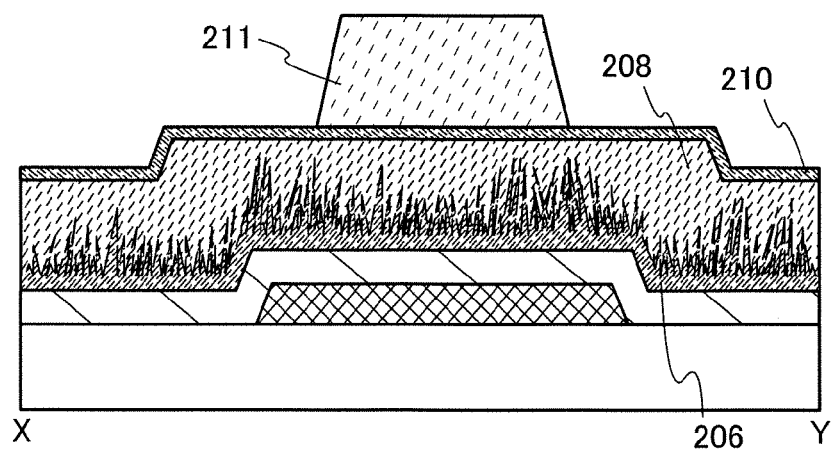

Next, a first semiconductor film 206, a second semiconductor film 208, and an impurity semiconductor film 210 are formed on the first insulating layer 204 by staking these films in this order, and an etching mask 211 is formed on the impurity semiconductor film 210 (FIG. 2B).

The first semiconductor film 206 may be formed from any semiconductor material with a high carrier mobility, which is preferably formed from a crystalline semiconductor. As the crystalline semiconductor, a microcrystalline semiconductor can be cited, for example. In this embodiment, the microcrystalline semiconductor refers to a semiconductor which has an intermediate structure between amorphous and crystalline structures (including a single crystalline structure and a polycrystalline structure). The microcrystalline semiconductor refers to a semiconductor which has a third state stable in terms of free energy, a crystalline semiconductor which has a short-range order and lattice distortion, and a semiconductor of columnar or needle-like crystal grains grown in a normal direction to the substrate surface, which have a crystal grain size of 2 nm or more and 200 nm or less, preferably 10 nm or more and 80 nm or less, more preferably 20 nm or more and 50 nm or less. For this reason, there may be a case where crystal grain boundaries are formed at the interfaces between the columnar or needle-like crystal grains. It is to be noted that the crystal grain size means the maximum diameter of a crystal grain in a plane parallel to the substrate surface. Furthermore, the crystal grains include an amorphous semiconductor region and a crystallite of a microcrystal which can be regarded as a single crystal. It is to be noted that the crystal grains may include a twin crystal.

Microcrystalline silicon may be used as the microcrystalline semiconductor. Microcrystalline silicon, which is one of microcrystalline semiconductors, has a Raman spectrum peak shifted to a lower wave number side than 520 $cm^{-1}$ that represents single crystalline silicon. More specifically, there is the Raman spectrum peak of the microcrystalline silicon between the wave number of 520 $cm^{-1}$ that represents single crystalline silicon and the wavenumber of 480 $cm^{-1}$ that represents amorphous silicon. In addition, the microcrystalline silicon contains at least 1 atomic % or more of hydrogen or halogen in order to terminate a dangling bond. Moreover, the microcrystalline silicon contains a rare gas element such as He, Ar, Kr, or Ne to further promote lattice distortion, thereby providing a favorable microcrystalline semiconductor with increased stability.

Further, when the concentration (the measurement value obtained by secondary ion mass spectrometry) of oxygen and nitrogen contained in the crystalline semiconductor film is reduced preferably to less than $1 \times 10^{18}$ $cm^3$, the crystallinity of the crystalline semiconductor film can be increased.

It is to be noted that the crystalline semiconductor film is preferably formed by a two-step deposition process, and in the two-step deposition process, for example, a microcrystalline silicon film on the order of 5 nm may be formed under a pressure on the order of 500 Pa in the first step, whereas a microcrystalline silicon film with a desired thickness may be formed under a pressure on the order of 5000 Pa in the second step. In the second step, the flow ratio of silane may be rather made lower to provide a condition in higher dilution than in the first step.

The second semiconductor film 208 functions as a buffer layer, which may be formed from a semiconductor material with its carrier mobility lower than that of the first semiconductor film 206. The second semiconductor film 208 is preferably a semiconductor film which includes an amorphous semiconductor and microscopic semiconductor crystal grains, has lower energy at the Urbach edge, measured by a constant photocurrent method (CPM) or photoluminescence spectrometry, and a smaller quantity of defect absorption spectra, as compared with conventional amorphous semiconductors. This semiconductor film is a well-ordered semiconductor film which has fewer defects and has a level with a steeper tail slope at the band edge (mobility edge) of the valence band, as compared with conventional amorphous semiconductor films.

The second semiconductor film 208 may contain halogen and nitrogen. In the case of containing nitrogen, the second semiconductor film 208 may contain nitrogen as a NH group or a $NH_2$ group.

It is to be noted that in the present embodiment, the interface region between the first semiconductor film 206 and the second semiconductor film 208 includes microcrystalline semiconductor regions and an amorphous semiconductor region filling the gaps between the microcrystalline semiconductor regions. Specifically, the interface region is composed of microcrystalline semiconductor regions extending conically from the first semiconductor film 206 and "a film containing an amorphous semiconductor", which is similar to the second semiconductor film 208.

The off-state current of the transistor can be reduced, because the second semiconductor film 208 provides a buffer layer. Further, the interface region has the conically extending microcrystalline semiconductor regions, thus making it possible to lower the resistance in the vertical direction (the film thickness direction), that is, the resistance between the second semiconductor film 208 and a source region or a drain region composed of the impurity semiconductor film 210, and thereby increase the on-state current of the transistor. More specifically, as compared with the case of applying a conventional amorphous semiconductor, the decrease in on-state current can be even suppressed while sufficiently reducing the off-state current and, and thus, the switching characteristics of the transistor can be improved.

It is to be noted that in the completed transistor, the on-state current is decreased when the first semiconductor layer formed from the first semiconductor film 206 is made thinner, whereas the contact area is increased between the first semiconductor layer formed from the first semiconductor film 206 and the second conductive layer formed later to increase the off-state current, when the first semiconductor layer formed from the first semiconductor film 206 is made thicker. Therefore, in order to increase the ON/OFF ratio, it is preferable to make the first semiconductor film 206 thicker, and further apply an insulation treatment to sidewalls of a thin film laminated body 212 including the first semiconductor layer formed from the first semiconductor film 206 as described later.

Most of the microcrystalline semiconductor region described above is preferably composed of crystal grains in a conical shape with a tip getting narrower from the first semiconductor film 206 toward the second semiconductor film 208. Alternatively, most of the microcrystalline semiconductor region may be composed of crystal grains getting wider from the first semiconductor film 206 toward the second semiconductor film 208.

When the microcrystalline semiconductor region includes crystal grains extending conically with a tip getting narrower from the first semiconductor film 206 toward the second semiconductor film 208 in the interface region, the proportion of the microcrystalline semiconductor region on the first semiconductor film 206 side is higher than that on the second semiconductor film 208 side. The microcrystalline semiconductor region grows from the surface of the first semiconductor film 206 in the thickness direction. When the flow rate of hydrogen with respect to a deposition gas (for example, silane) is low (that is, the dilution ratio is low) in a raw material gas, or when the concentration of a raw material gas containing nitrogen is high, the crystal growth is suppressed in the microcrystalline semiconductor region to provide crystal grains in a conical shape, with the result that the semiconductor formed by deposition is mostly an amorphous semiconductor.

Further, the interface region preferably contains nitrogen, in particular, an NH group or an $NH_2$ group. This is because defects are reduced and carriers flow easily, when nitrogen, in particular, an NH group or an $NH_2$ group is bonded to dangling bonds of silicon atoms at the interfaces of crystals included in the microcrystalline semiconductor region or at the interface between the microcrystalline semiconductor region and the amorphous semiconductor region. For this reason, the nitrogen, preferably an NH group or an $NH_2$ group contained at $1 \times 10^{20}$ $cm^{-3}$ to $1 \times 10^{21}$ $cm^{-3}$ makes it easy to provide the dangling bonds of the silicon atoms cross-linked with nitrogen, preferably an NH group or an $NH_2$ group, thereby making carriers more likely to flow. As a result, the bonding for promoting the carrier transfer can be provided at crystal grain boundaries or defects, thereby resulting in an improvement in the carrier mobility of the interface region described above. Therefore, the field effect mobility of the transistor is improved.

Furthermore, the reduced oxygen concentration of the interface region can reduce the defect density at the interface between the microcrystalline semiconductor region and the amorphous semiconductor region or the interface between the crystal grains to reduce bonding for inhibiting the carrier transfer.

The impurity semiconductor film 210 is formed from a semiconductor doped with an impurity element for imparting one conductivity type. In the case where the transistor is an n-channel transistor, the semiconductor doped with the impurity element for imparting one conductivity type can include, for example, silicon doped with P or As. Alternatively, in the case where the transistor is a p-channel transistor, it is also possible to carry out doping with, for example, B as the impurity element for imparting one conductivity type. However, the transistor is preferably an n-type transistor. Therefore, silicon doped with P is used as an example in this embodiment. It is to be noted that the impurity semiconductor film 210 may be formed from an amorphous semiconductor, or formed from a crystalline semiconductor such as a microcrystalline semiconductor.

It is to be noted that the first insulating layer 204, the first semiconductor film 206, the second semiconductor film 208 and the impurity semiconductor film 210 are preferably formed continuously in the same chamber. This is to prevent impurities from being incorporated at the interfaces between the respective layers of the first insulating layer 204, the first semiconductor film 206, the second semiconductor film 208 and the impurity semiconductor film 210.

The etching mask 211 may be formed from a resist material.

Figure 2C:
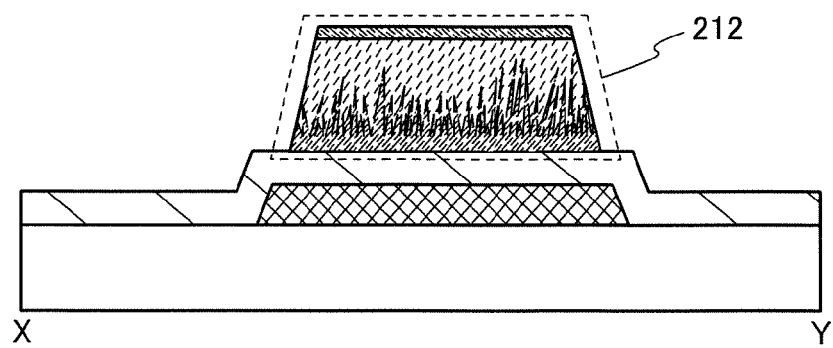

Next, with the use of the etching mask 211, the first semiconductor film 206, the second semiconductor film 208, and the impurity semiconductor film 210 are subjected to etching to form the thin film laminated body 212 (FIG. 2C).

It is to be noted that it is preferable in this embodiment to apply an insulation treatment to the sidewalls of the thin film laminated body 212 as described above. That is because it is often the case that the off-state current is increased when the first semiconductor layer and second conductive layer of the completed transistor are brought in contact with each other. As one example of the insulation treatment, a treatment can be cited in which the sidewalls of the thin film laminated body 212 are exposed to oxygen plasma or nitrogen plasma. Alternatively, a treatment can be cited in which an insulating film is formed with the sidewalls of the thin film laminated body 212 exposed, and the insulating film is subjected to etching in a direction perpendicular to the surface of the substrate 200 by a highly anisotropic etching method to form sidewall insulating layers in contact with the sidewalls of the thin film laminated body 212.

Figure 3A:
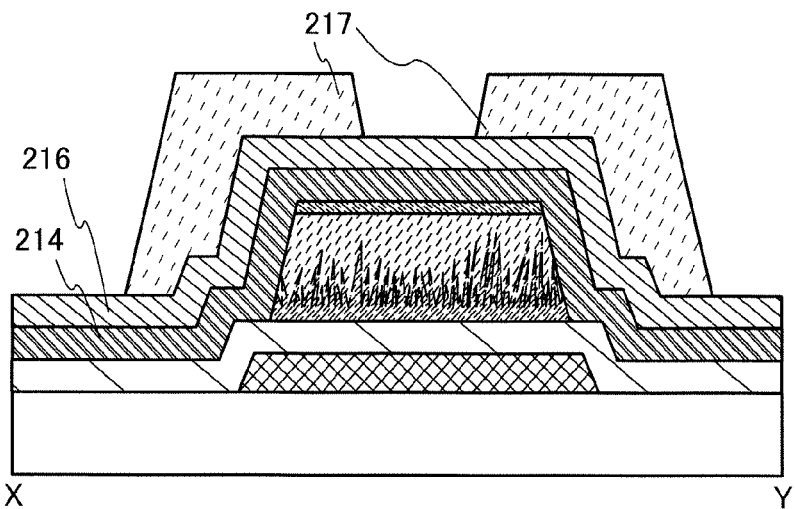
FIGS. 3A to 3C diagrams illustrating a method for manufacturing a semiconductor device according to an embodiment of the present invention.

Next, a conductive film 214 and an insulating film 216 are formed on the first insulating layer 204 and the thin film laminated body 212, and an etching mask 217 is formed on the insulating film 216 (FIG. 3A).

The conductive film 214 may be formed from a conductive material (e.g., a metal or a semiconductor doped with an impurity element for imparting one conductivity type) in the same way as in the case of the first conductive layer 202. It is to be noted that the conductive film 214 may be formed to have a single layer, or formed to have multiple layers stacked. The conductive film 214 is formed as, for example, a stacked structure of three layers with an Al layer sandwiched between Ti layers.

The insulating film 216 may be formed by using the same material and the method as in the case of the first insulating layer 204. It is to be noted that the insulating film 216 may be formed to have a single layer, or formed to have multiple layers stacked. In this embodiment, the insulating film 216 may be formed from, for example, silicon nitride.

The etching mask 217 may be formed from a resist material.

Figure 3B:
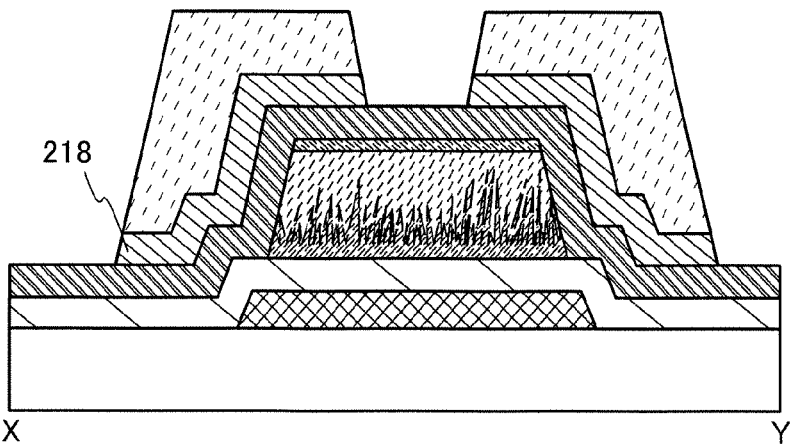

Next, the insulating film 216 is subjected to etching with the use of the etching mask 217 to form a second insulating layer 218 (FIG. 3B).

Figure 3C:
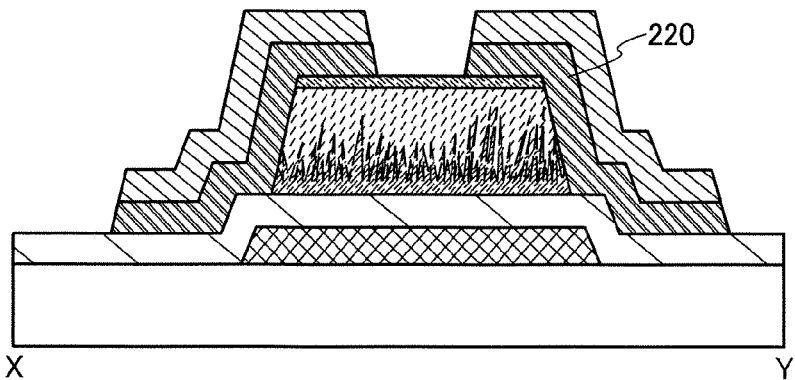

Next, the conductive film 214 is subjected to etching to form a second conductive layer 220 (FIG. 3C).

It is to be noted that the step of etching the insulating film 216 (the step of processing from the state in FIG. 2A to the state in FIG. 2B) and the step of etching the conductive film 214 (the step of processing from the state in FIG. 2B to the state in FIG. 2C) are preferably carried out simultaneously in accordance with the same etching step. This is because the manufacturing process is simplified.

It is to be noted that the conductive film 214 may be subjected to etching with the use of the second insulating layer 218 as an etching mask. In this case, the etching mask 217 may be removed before the conductive film 214 is subjected to etching to form the second conductive layer 220.

It is to be noted that when the conductive film 214 is subjected to etching to form the second conductive layer 220, the thin film laminated body 212 may have an upper portion etched in many cases.

Figure 4A:
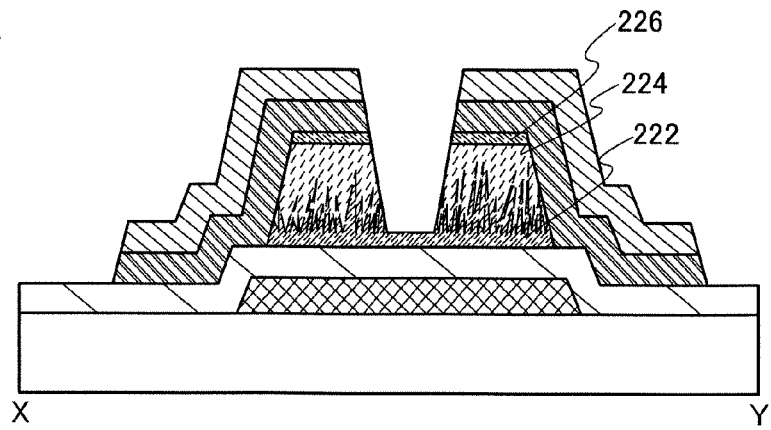
FIGS. 4A to 4C are diagrams illustrating a method for manufacturing a semiconductor device according to an embodiment of the present invention.

Next, an upper portion of the thin film laminated body 212 is subjected to etching to form a first semiconductor layer 222, a second semiconductor layer 224, and an impurity semiconductor layer 226 (FIG. 4A). In this case, while the thin film laminated body 212 may be subjected to etching in accordance with one or more steps, the etching is carried out until a portion of the first semiconductor layer 222 which is not overlapped with the second semiconductor layer 224 (that is, a portion to serve as a channel forming region) is exposed ultimately.

It is to be noted that the step of etching the conductive film 214 to form the second conductive layer 220 and the step of etching an upper portion of the thin film laminated body 212 to form the first semiconductor layer 222, the second semiconductor layer 224, and the impurity semiconductor layer 226 may be carried out simultaneously as one step.

Figure 4B:
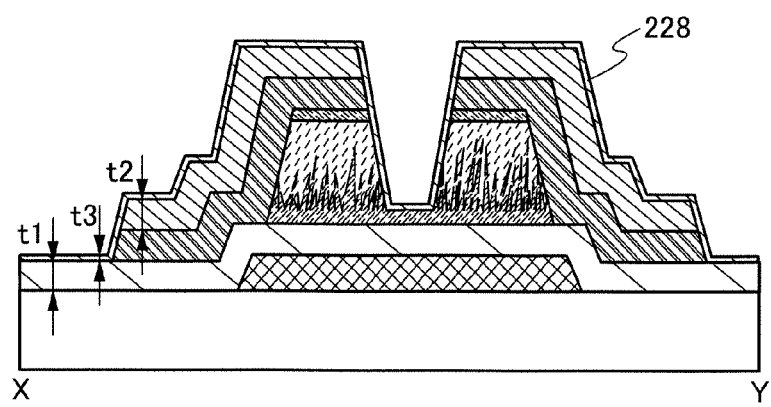

Next, a third insulating layer 228 is formed (FIG. 4B).

The third insulating layer 228 may be formed from an insulating material in the same way as in the case of the first insulating layer 104. It is to be noted that the third insulating layer 228 may be formed to have a single layer, or formed to have multiple layers stacked. In this embodiment, the third insulating layer 228 may be formed from, for example, silicon nitride.

Figure 4C:
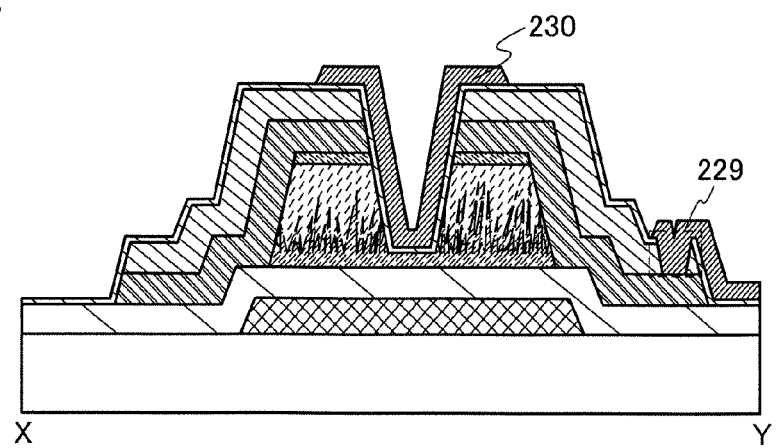

Next, an opening 229 is formed in the second insulating layer 218 and the third insulating layer 228, and a third conductive layer 230 is formed so as to be connected to the second conductive layer 220 at the opening 229 (FIG. 4C).

It is to be noted that in the present embodiment, at least at the stage of FIG. 4B, the thickness $t_1$ of the first insulating layer 204 is substantially the same as the thickness $t_2$ of the second insulating layer 218, that is, $t_1 \approx t_2$.

Further, in the present embodiment, the second insulating layer 218 serves as an interlayer insulating layer. The third insulating layer 228 constitutes at least a passivation layer and a gate insulating layer for a second gate electrode composed of the third conductive layer 230. Furthermore, the second conductive layer 220 constitutes at least a source and a drain electrode.

It is to be noted that in the present embodiment, at least at the stage of FIG. 4C, the third insulating layer 228 is preferably thin. More specifically, the thickness $t_3$ of the third insulating layer 228 is preferably small. This is because the field effect mobility of the thin film transistor can be improved to increase the on-state current when the gate insulating layer is made thinner to reduce the effective film thickness, while the third insulating layer 228 constitutes the gate insulating layer provided between the second gate electrode composed of the third conductive layer 230 and the first semiconductor layer 222.

It is to be noted that when the second conductive layer 220 and the third conductive layer 230 are provided to be overlapped with each other, the third insulating layer 228 made thinner will increase the parasitic capacitance between the source electrode and drain electrode composed of the second conductive layer 220 and the second gate electrode composed of the third conductive layer 230. Therefore, the second insulating layer 218 may be rather made thicker. More specifically, the thickness $t_2$ of the second insulating layer 218 is preferably large.

On the other hand, the third insulating layer 228 made thicker as described above has no actual advantage. Accordingly, in the structure described above, the thickness $t_3$ of the third insulating layer 228 is preferably smaller than the thickness $t_1$ of the first insulating layer 204 and than the thickness $t_2$ of the second insulating layer 218.

It is to be noted that the first insulating layer 204, the second insulating layer 218, and the third insulating layer 228 are preferably formed from silicon nitride.

It is to be noted that when the first insulating layer 204 and the second insulating layer 218 are silicon nitride layers, the first insulating layer 204 may have a thickness of approximately 250 nm or more and 450 nm or less.

Furthermore, when the third insulating layer 228 is a silicon nitride layer, the third insulating layer 228 may have a thickness of 60 nm or mode and less than 250 nm.

More specifically, among the first insulating layer 204, the second insulating layer 218, and the third insulating layer 228, the third insulating layer 228 may have the smallest thickness, whereas the first insulating layer 204 and the second insulating layer 218 may have the same level of thickness. More specifically, the relationship of $t_3 < t_1 \approx t_2$ is preferable.

The third conductive layer 230 can be formed with the use of a conductive composition containing a conductive high molecule (also referred to as a conductive polymer) which has a light-transmitting property. It is preferable that the third conductive layer 230 formed with the use of the conductive composition have a sheet resistance of 10000 Ω/square or less and a light transmittance of 70% or more at a wavelength of 550 nm. Further, the resistivity of the conductive high molecule contained in the conductive composition is preferably less than or equal to 0.1 Ω·cm.

As the conductive high molecule, a so-called "π-electron conjugated conductive high molecule" can be used. Examples of the π-electron conjugated conductive high molecule include, for example, polyaniline or derivatives thereof; polypyrrole or derivatives thereof; polythiophene; polythiophene or derivatives thereof; or copolymers of two or more of aniline, pyrrole, and thiophene or derivatives of the copolymers.

The third conductive layer 230 can be formed with the use of, for example, an indium oxide containing a tungsten oxide, an indium zinc oxide containing a tungsten oxide, an indium oxide containing a titanium oxide, an indium tin oxide containing a titanium oxide, an indium tin oxide (hereinafter referred to as an ITO), an indium zinc oxide, an indium tin oxide with a silicon oxide added, etc.

The third conductive layer 230 may be formed in such a way that a film formed from the above-mentioned material is subjected to processing by a photolithography method.

When the third conductive layer 230 is formed from a light-transmitting material, the third conductive layer 230 is allowed to function as a pixel electrode.

It is to be noted that, although not shown, a fourth insulating layer may be formed between the third insulating layer 228 and the third conductive layer 230. The fourth insulating layer is preferably overlapped with a portion of the second conductive layer. The fourth insulating layer may be preferably formed by a method which provides the fourth insulating layer a substantially flat surface, because the substantially flat surface of the fourth insulating layer can prevent disconnection, etc. of a pixel electrode layer formed on the fourth insulating layer. Therefore, the term "substantially flat" herein refers to flatness to such an extent that can achieve the object described above, not to high flatness required.

The fourth insulating layer can be formed, for example, by a spin coating method or the like with the use of a photosensitive polyimide, acrylic, an epoxy resin, or the like. However, the fourth insulating layer is not to be considered limited to these materials or methods for forming the fourth insulating layer.

As described above, the semiconductor device according to Embodiment 1 can be manufactured in accordance with the simplified steps.

It is to be noted that the substrate 200 corresponds to the substrate 100 in Embodiment 1.

Further, the first conductive layer 202 corresponds to the first conductive layer 102 in Embodiment 1.

Further, the first insulating layer 204 corresponds to the first insulating layer 104 in Embodiment 1.

Further, the first semiconductor layer 222 corresponds to the first semiconductor layer 106 in Embodiment 1.

Further, the second semiconductor layer 224 corresponds to the second semiconductor layer 108 in Embodiment 1.

Further, the impurity semiconductor layer 226 corresponds to the impurity semiconductor layer 110 in Embodiment 1.

Further, the second conductive layer 220 corresponds to the second conductive layer 112 in Embodiment 1.

Further, the second insulating layer 218 corresponds to the second insulating layer 114 in Embodiment 1.

Further, the third insulating layer 228 corresponds to the third insulating layer 116 in Embodiment 1.

Further, the third conductive layer 230 corresponds to the third conductive layer 118 in Embodiment 1.

It is to be noted that the opening 229 corresponds to the first opening 120 in Embodiment 1.

In addition, the second conductive layer 112 and the third conductive layer 118 are connected to each other at the first opening 120 in Embodiment 1. Furthermore, the first conductive layer 102 and the third conductive layer 118 are connected to each other at the second opening 122. Now, a method for forming the opening 229 and the opening 231 will be described. The opening 229 is an opening which reaches the second conductive layer 112, and the opening 231 is an opening which reaches the first conductive layer 102.

The opening 229 and the opening 231 may be formed in accordance with one etching step, or formed in accordance with multiple etching steps.

Figures 1, 5A:
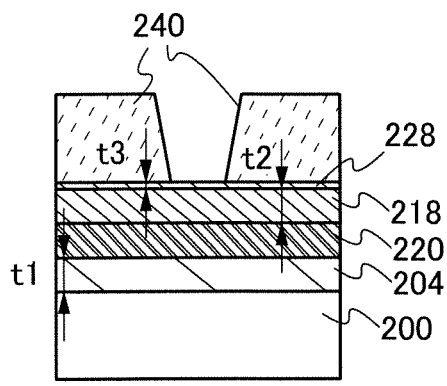
FIGS. 5A-1 through 5C-1 and 5A-2 through 5C-2 are diagrams illustrating a method for manufacturing a semiconductor device according to an embodiment of the present invention.
Figures 2, 5A:
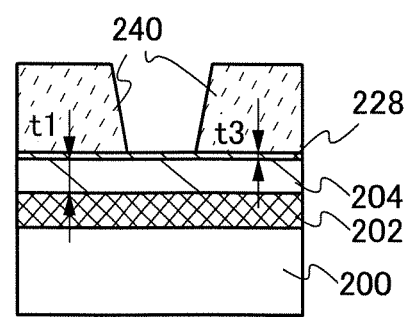
Figures 1, 5B:
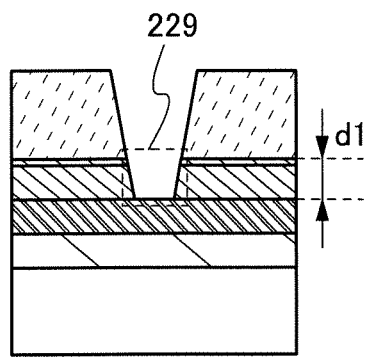
Figures 2, 5B:
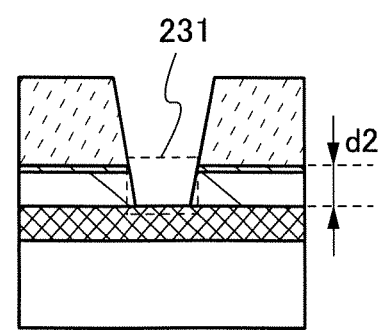
Figures 1, 5C:
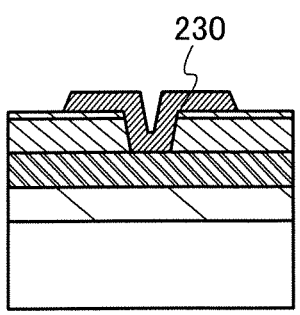
Figures 2, 5C:
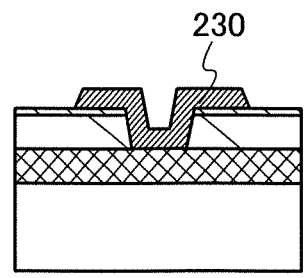

FIGS. 5A-1 through 5C-1 are diagrams illustrating a method for forming the opening 229, whereas FIGS. 5A-2 through 5C-2 are diagrams illustrating a method for forming the opening 231.

First, an etching mask 240 is formed on a section other than a section where the opening 229 or the opening 231 is to be formed (FIG. 5A-1 and FIG. 5A-2).

In the section where the opening 229 is to be formed, the first insulating layer 204, the second conductive layer 220, the second insulating layer 218, and third insulating layer 228 are provided on the substrate 200. On the other hand, in the section where the opening 231 is to be formed, the first conductive layer 202, the first insulating layer 204, and the third insulating layer 228 are provided on the substrate 200. In this case, the relationship of $t_1 \approx t_2$, preferably $t_3 < t_1 \approx t_2$ is satisfied.

Next, with the use of an etching mask 240, the second insulating layer 218 and the third insulating layer 228 are subjected to etching to form the opening 229, and at the same time, the first insulating layer 204 and the third insulating layer 228 are subjected to etching to form the opening 231 (FIG. 5B-1 and FIG. 5B-2). In this case, the relationship of $t_1 \approx t_2$ thus causes less etching damage to the first conductive layer 202 and the second conductive layer 220 provided under the film to be etched.

Alternatively, depending on the etching gas, etc. for use in the formation of the opening 229 and the opening 231, there may be cases where it is difficult to increase the etching selectivity between the first conductive layer 202 and the second conductive layer 220. In such a case, when the thickness $t_1$ of the first insulating layer 204 differs substantially from the thickness $t_2$ of the second insulating layer 218, one or both of the first conductive layer 202 and the second conductive layer 220 will be etched to cause defective wiring formation. When the thickness $t_1$ of the first insulating layer 204 is made almost equal to the thickness $t_2$ of the second insulating layer 218, the decrease in yield can be prevented without causing defective wiring formation.

It is to be noted that the depth $d_1$ of the opening 229 is almost equal to the depth $d_2$ of the opening 231 in this case. More specifically, the relationship of $d_1 \approx d_2$ is satisfied.

Next, the third conductive layer 230 is selectively formed in each of the opening 229 and the opening 231 (FIG. 5C-1 and FIG. 5C-2).

Alternatively, as shown in FIGS. 6A-1 through 6D-1 and 6A-2 through 6D-2, the formation of the opening 229 and the opening 231 may be carried out in accordance with a two-step etching step.

Figures 1, 6A:
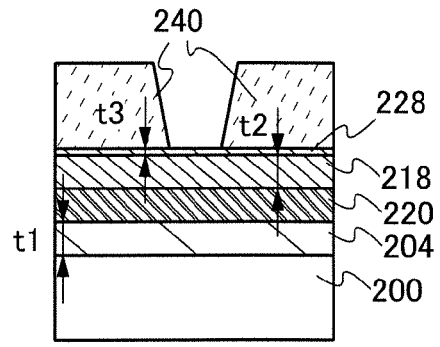
Figures 2, 6A:
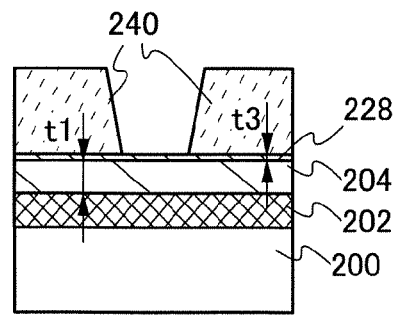
Figures 1, 6B:
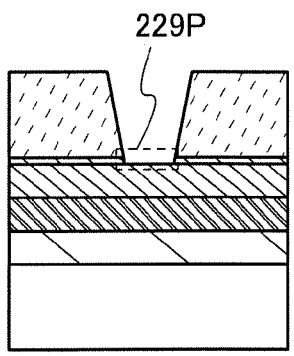
Figures 2, 6B:
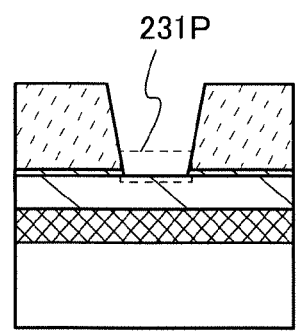
Figures 1, 6C:
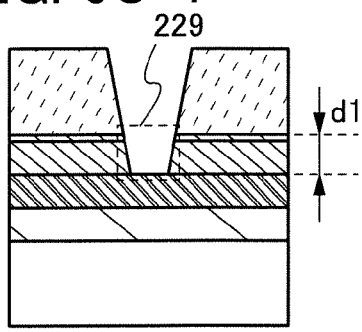
Figures 2, 6C:
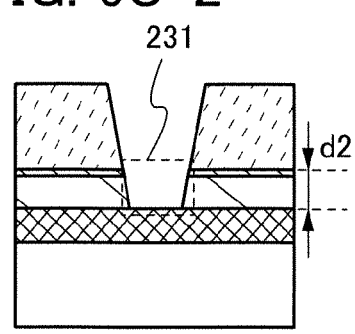
Figures 1, 6D:
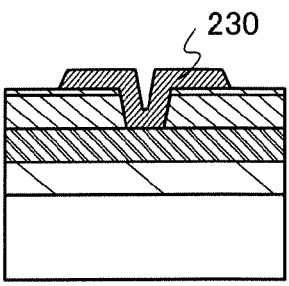
Figures 2, 6D:
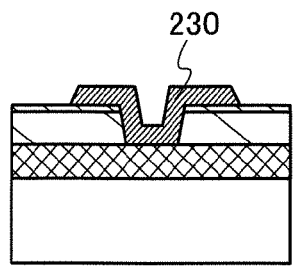

FIGS. 6A-1 through 6D-1 are diagrams illustrating a method for forming the opening 229 in accordance with a two-step etching step, whereas FIGS. 6A-2 through 6D-2 are diagrams illustrating a method for forming the opening 231 in accordance with a two-step etching step.

First, an etching mask 240 is formed on a section other than a section where the opening 229 or the opening 231 is to be formed (FIG. 6A-1 and FIG. 6A-2). As in the case of FIGS. 5A-1 through 5C-1 and FIGS. 5A-2 through 5C-2, in the section where the opening 229 is to be formed, the first insulating layer 204, the second conductive layer 220, the second insulating layer 218, and third insulating layer 228 are provided on the substrate 200. On the other hand, in the section where the opening 231 is to be formed, the first conductive layer 202, the first insulating layer 204, and the third insulating layer 228 are provided on the substrate 200.

Next, the third insulating layer 228 is subjected to etching with the use of etching mask 240 to form an opening 229P and an opening 231P ((FIG. 6B-1 and FIG. 6B-2).

Next, the second insulating layer 218 in the section of the opening 229P is subjected to etching to form the opening 229, and at the same time, the first insulating layer 204 in the section of the opening 231P is subjected to etching to form the opening 231 (FIG. 6C-1 and FIG. 6C-2).

Next, the third conductive layer 230 is selectively formed in each of the opening 229 and the opening 231 (FIG. 6D-1 and FIG. 6D-2).

It is to be noted that in FIGS. 6A-1 through 6D-1 and FIGS. 6A-2 through 6D-2, the same relationships as in the case of FIGS. 5A-1 through 5C-1 and FIGS. 5A-2 through 5C-2 are satisfied among the thickness $t_1$ of the first insulating layer 204, the thickness $t_2$ of the second insulating layer 218, and the thickness $t_3$ of the third insulating layer 228, and between the depth $d_1$ of the opening 229 and the depth $d_2$ of the opening 231. More specifically, the relationship of $t_1 \approx t_2$, preferably $t_3 < t_1 \approx t_2$ is satisfied. Furthermore, the relationship of $d_1 \approx d_2$ is satisfied.

As described above, the opening 229 and the opening 231 can be formed.

Embodiment 3

Semiconductor devices obtained by applying the thin film transistor manufactured in accordance with the embodiments described above include electronic papers. The electronic papers can be used for electronic devices in all fields as long as the papers can display information. For example, the electronic papers can be applied to electronic book readers (e-books), posters, digital signages, public information displays (PID), advertisements in vehicles such as trains, displays of various cards such as credit cards, etc. An example of the electronic devices is illustrated in FIG. 7.

Figure 7:
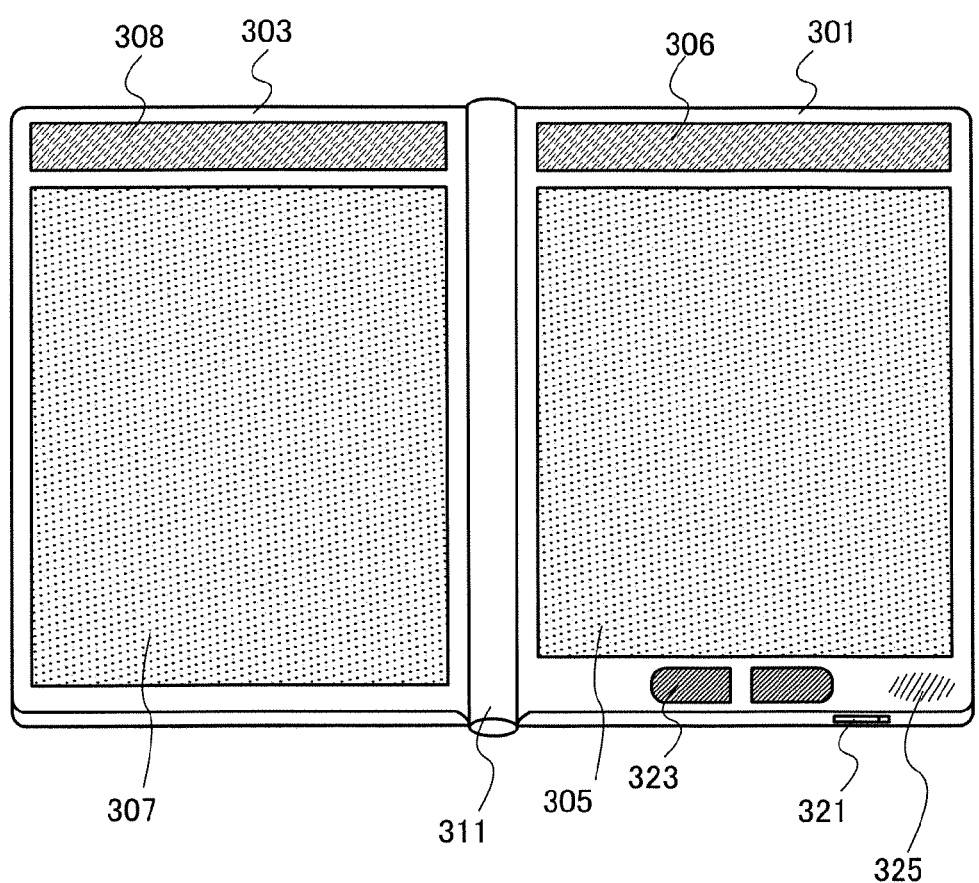
FIG. 7 is a diagram illustrating a semiconductor device according to an embodiment of the present invention.

FIG. 7 illustrates an example of an electronic book. For example, an electronic book 300 includes two housings of a housing 301 and a housing 303. The housing 301 and the housing 303 are combined with a hinge 311 so that the electronic book 300 can be opened and closed with the hinge 311 as an axis. This structure allows the electronic book 300 to be handled in the same way as paper books.

A display section 305 and a photoelectric conversion device 306 are incorporated in the housing 301, whereas a display section 307 and a photoelectric conversion device 308 are incorporated in the housing 303. The display section 305 and the display section 307 may be configured to display a continuous image or different images. When the display section 305 and the display section 307 are configured to display different images, for example, texts can be displayed on the right display section (the display section 305 in FIG. 7), whereas images can be displayed on the left display section (the display section 307 in FIG. 7).

In addition, FIG. 7 illustrates an example in which the housing 301 is provided with an operation unit and the like. For example, the housing 301 is provided with a power switch 321, operation keys 323, a speaker 325, etc. The operation keys 323 can be used to turn pages. It is to be note that a keyboard, a pointing device, or the like may also be provided on the same surface of the housing as the display section. In addition, the back surface or side surface of the housing may be configured to include an external connection terminal (an earphone terminal, a USB terminal, a terminal that can be connected to an AC adapter or a variety of cables such as a USB cable, or the like), a recording medium insertion portion, and the like. Further, the electronic book 300 may be configured to have the function of an electronic dictionary.

The electronic book 300 may be configured to have the capability to wirelessly transmit and receive data. It is also possible to purchase and download desired book data or the like from an electronic book server through wireless communication.

Embodiment 4

Semiconductor devices obtained by applying the thin film transistor manufactured in accordance with the embodiments described above include a variety of electronic devices (including game machines) besides electronic papers. Examples of the electronic devices include a television set (also referred to as a television or a television receiver), a monitor for a computer or the like, a digital camera, a digital video camera, a digital photo frame, a mobile phone handset (also referred to as a mobile phone or a mobile phone device), a portable game console, a portable information terminal, an audio reproducing device, and a large-sized game machine such as a pachinko machine.

Figure 8A:
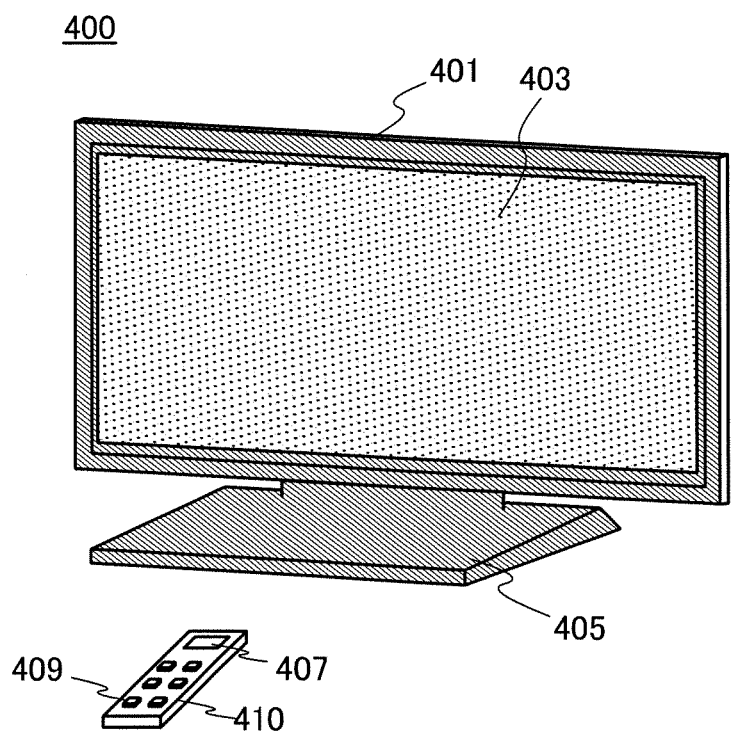
FIGS. 8A and 8B are diagrams illustrating semiconductors according to an embodiment of the present invention.

FIG. 8A illustrates an example of a television set. The television set 400 has a display unit 403 incorporated in a housing 401. The display unit 403 can display images. In addition, FIG. 8A shows the housing 401 supported by a stand 405 in this case.

The television set 400 can be operated by operation switches incorporated in the housing 401 or a separate remote controller 410. Operation keys 409 incorporated in the remote controller 410 can be used to operate the channels and volume, and manipulate videos displayed on the display unit 403. Furthermore, the remote controller 410 may be provided with a display unit 407 for displaying information output from the remote controller 410.

It is to be noted that the television set 400 is provided with a receiver, a modem, etc. The receiver can receive public television broadcasts, and furthermore, when the receiver is connected to a communication network in a wired or wireless manner via the modem, one-way (from a sender to a receiver) or two-way (between a sender and a receiver or between receivers, etc.) information communication can also be performed.

Figure 8B:
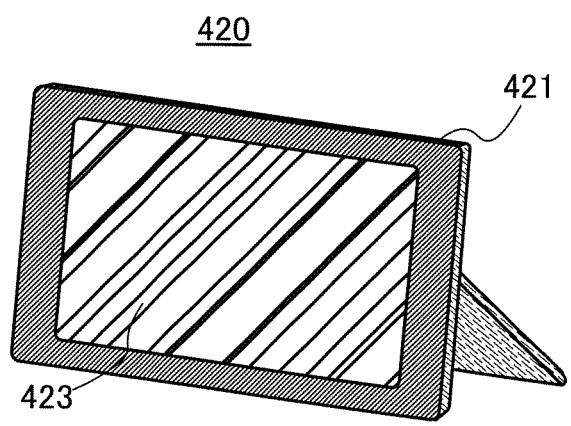

FIG. 8B illustrates an example of a digital photo frame. For example, the digital photo frame 420 has a display unit 423 incorporated in a housing 421. The display unit 423 is capable of displaying various types of images, and allowed to operate in the same as usual photo frames through display with image data taken with, for example, a digital camera or the like.

It is to be noted that the digital photo frame 420 is provided with an operation unit, an external connection terminal (such as a USB terminal, a terminal which can be connected to various types of cables including a USB cable, etc.), a recording medium insertion unit, etc. Although these components may be incorporated in the same plane as the display unit, it is preferable to the components on the side surface or the back surface for improvement in design. For example, a memory storing image data taken with a digital camera can be inserted into the recording medium insertion unit of the digital photo frame to retrieve image data, and display the retrieved image data on the display unit 423.

The digital photo frame 420 may be configured to transmit and receive information wirelessly. The digital photo frame 420 can also be configured to retrieve and display desired image data wirelessly.

Figure 9:
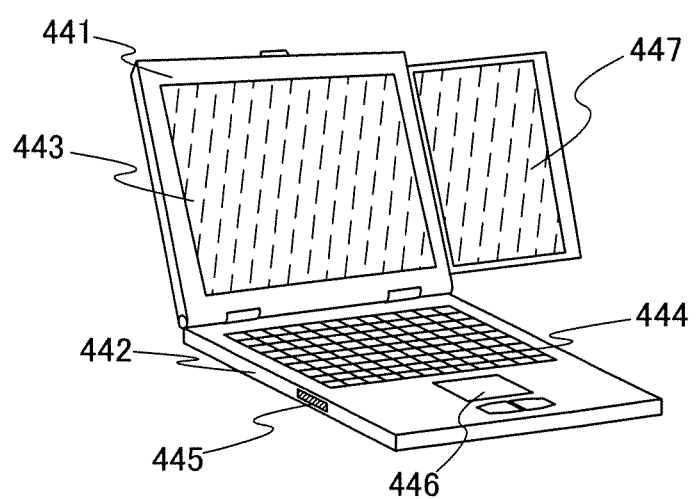
FIG. 9 is a diagram illustrating a semiconductor device according to an embodiment of the present invention.

FIG. 9 is a perspective view illustrating an example of a portable computer.

In the portable computer of FIG. 9, an upper housing 441 including a display section 443 and a lower housing 442 including a keyboard 444 can be overlapped with each other by closing a hinge unit for connecting the upper housing 441 and the lower housing 442. Thus, the portable computer is convenient to carry about, and in the case of keyboard input by the user, the hinge unit is opened so that the user can carry out input operation while looking at the display section 443.

In addition, the lower housing 442 includes a pointing device 446 with which input operation can be carried out, in addition to the keyboard 444. Furthermore, when the display section 443 is a touch input panel, input operation can be carried out by touching a portion of the display section. In addition, the lower housing 442 includes a calculation function unit such as a CPU or hard disk. In addition, the lower housing 442 includes an external connection port 445 into which another device, for example, a communication cable in conformity with communication standards of a USB is inserted.

The upper housing 441 further includes a display section 447 therein which can be housed by sliding into the upper housing 441, thereby allowing for the achievement of a larger display screen. In addition, the user can adjust the orientation of the screen of the display section 447 which can be housed in the upper housing 441. Furthermore, when the display section 447 which can be housed in the upper housing 441 is a touch input panel, input operation can also be carried out by touching a portion of the display section 447 which can be housed in the upper housing 441.

The display section 443 or the display section 447 which can be housed in the upper housing 441 uses an image display device such as a liquid crystal display panel, and a light-emitting display panel such as an organic light-emitting element or an inorganic light-emitting element.

In addition, the portable computer illustrated in FIG. 9 can be provided with a receiver or the like to receive TV broadcasts and display the videos on the display section. In addition, the user can also watch a TV broadcast by sliding the display section 447 to expose the entire screen and adjusting the angle of the screen while the hinge unit for connecting the upper housing 441 and the lower housing 442 is kept closed. In that case, the display section 443 is not allowed for display with the hinge unit closed, and moreover, only a circuit is started up for displaying the TV broadcasting. Thus, minimum power can be consumed, which is useful in portable computers limited in battery capacity.

This application is based on Japanese Patent Application serial no. 2010-189916 filed with Japan Patent Office on Aug. 26, 2010, the entire contents of which are hereby incorporated by reference.

What is claimed is:

1. A method for manufacturing a semiconductor device comprising the steps of:
   forming a first insulating layer over a first conductive layer;
   forming a first semiconductor layer over the first insulating layer;
   forming a second semiconductor layer over the first semiconductor layer;
   forming an impurity semiconductor layer over the second semiconductor layer;
   etching the impurity semiconductor layer, the second semiconductor layer and the first semiconductor layer with a first predetermined mask;
   forming a second conductive layer over the impurity semiconductor layer;
   forming a second insulating layer over the second conductive layer;
   etching the second insulating layer and the second conductive layer with a second predetermined mask to form a pair of second insulating layers and a pair of second conductive layers;
   etching the impurity semiconductor layer and the second semiconductor layer to form a pair of impurity semiconductor layers and a pair of second semiconductor layers so as to expose the first semiconductor layer between the pair of second semiconductor layers;
   forming a third insulating layer at least over the pair of second insulating layers, the first semiconductor layer and the first insulating layer;
   forming a first opening portion in the third insulating layer and the first insulating layer;
   forming a second opening portion in the third insulating layer and one of the pair of second insulating layers; and
   forming a third conductive layer over the third insulating layer,
   wherein a thickness of the first insulating layer is substantially equal to a thickness of the pair of second insulating layers.

2. A method for manufacturing a semiconductor device comprising the steps of:
   forming a first insulating layer over a first conductive layer;
   forming a first semiconductor layer over the first insulating layer;
   forming a second semiconductor layer over the first semiconductor layer;
   forming an impurity semiconductor layer over the second semiconductor layer;

etching the impurity semiconductor layer, the second semiconductor layer and the first semiconductor layer with a first predetermined mask;
forming a second conductive layer over the impurity semiconductor layer;
forming a second insulating layer over the second conductive layer;
etching the second insulating layer and the second conductive layer with a second predetermined mask to form a pair of second insulating layers and a pair of second conductive layers;
etching the impurity semiconductor layer and the second semiconductor layer to form a pair of impurity semiconductor layers and a pair of second semiconductor layers so as to expose the first semiconductor layer between the pair of second semiconductor layers;
forming a third insulating layer at least over the pair of second insulating layers, the first semiconductor layer and the first insulating layer;
forming a first opening portion in the third insulating layer and the first insulating layer;
forming a second opening portion in the third insulating layer and one of the pair of second insulating layers; and
forming a third conductive layer over the third insulating layer, wherein a depth of the first opening portion is substantially equal to a depth of the second opening portion.

3. The method for manufacturing a semiconductor device according to claim 1,
wherein the second insulating layer and the second conductive layer are etched with a same etching step.

4. The method for manufacturing a semiconductor device according to claim 2,
wherein the second insulating layer and the second conductive layer are etched with a same etching step.

5. The method for manufacturing a semiconductor device according to claim 1,
wherein a thickness of the first insulating layer is 250 nm or more and 450 nm or less, and
wherein a thickness of the third insulating layer is 60 nm or more and less than 250 nm.

6. The method for manufacturing a semiconductor device according to claim 2,
wherein a thickness of the first insulating layer is 250 nm or more and 450 nm or less, and
wherein a thickness of the third insulating layer is 60 nm or more and less than 250 nm.

* * * * *